United States Patent [19]

Takiguchi et al.

[11] Patent Number: 4,862,472
[45] Date of Patent: Aug. 29, 1989

[54] SEMICONDUCTOR LASER DEVICE

[75] Inventors: Haruhisa Takiguchi; Shinji Kaneiwa, both of Nara; Hiroaki Kudo, Tenri; Chitose Sakane, Tenri; Toshihiko Yoshida, Tenri, all of Japan

[73] Assignee: Sharp Kabushiki Kaisha, Osaka, Japan

[21] Appl. No.: 143,730

[22] Filed: Jan. 14, 1988

[30] Foreign Application Priority Data

Jan. 16, 1987 [JP] Japan .................................. 62-8833

[51] Int. Cl.$^4$ .............................................. H01S 3/19
[52] U.S. Cl. ......................................... 372/45; 312/46
[58] Field of Search .................... 372/46, 45; 357/17

[56] References Cited

U.S. PATENT DOCUMENTS

| 4,366,569 | 12/1982 | Hirao et al. | 372/45 |
| 4,416,012 | 11/1983 | Botez et al. | 372/45 |
| 4,486,331 | 10/1984 | Thompson | 372/46 |
| 4,512,022 | 4/1985 | Tsang | 372/45 |
| 4,573,161 | 2/1986 | Sakai et al. | 372/45 |
| 4,631,802 | 12/1986 | Hayashi et al. | 372/45 |
| 4,635,268 | 1/1987 | Motegi et al. | 372/45 |
| 4,745,612 | 5/1988 | Hayakawa et al. | 372/45 |
| 4,750,183 | 6/1988 | Takahashi et al. | 372/45 |
| 4,757,510 | 6/1988 | Kaheno et al. | 372/45 |

FOREIGN PATENT DOCUMENTS

| 0044571 | 1/1982 | European Pat. Off. . |
| 0125738 | 11/1984 | European Pat. Off. . |
| 0206496 | 12/1986 | European Pat. Off. . |
| 0210616 | 2/1987 | European Pat. Off. . |
| 0215298 | 3/1987 | European Pat. Off. . |
| 59-48976 | 3/1984 | Japan . |
| 61-207090 | 9/1986 | Japan . |
| 1378128 | 12/1974 | United Kingdom . |
| 2100501A | 12/1982 | United Kingdom . |

OTHER PUBLICATIONS

Smith, Jul./Aug. 1986, Xerox Disclosure Journal 11(4): 151-152.
Hayakawa et al., (1986) Applied Physics Letters 49(11); 636-638.
Patent Abstracts of Japan (29 Nov. 1985), 9(302), E-362, 2025, Appl. No. 58-250138.
Patent Abstracts of Japan (28 Jun. 1984), 8(139), E-253, 1576, Appl. No. 57-160054.
Patent Abstracts of Japan (22 Nov. 1984), 8(256), E-280, 1693, Appl. No. 59-127893.
Kurobe et al., (1986) Electronics Letters 22(21):1117-1118.

Primary Examiner—William L. Sikes
Assistant Examiner—Georgia Y. Epps
Attorney, Agent, or Firm—Irell & Manella

[57] ABSTRACT

A semiconductor laser device comprising a double-heterostructure that is composed of an active layer and a pair of cladding layers sandwiching the active layer therebetween, and a stripe structure that is disposed on the double-heterostructure, the stripe structure being composed of a current blocking layer with a conductive type different from that of the adjacent cladding layer, and the current blocking layer having a striped groove constituting a current path, wherein the cladding layer that contacts the current blocking layer is composed of an $In_{1-s}Ga_sP_{1-t}As_t$ crystal material (wherein $0.51 \leq s \leq 1$, $0 \leq t \leq 1$ and $s = 2.04t - 1.04$).

4 Claims, 2 Drawing Sheets

SEMICONDUCTOR LASER DEVICE

BACKGROUND OF THE INVENTION

1. Field of the Invention

This invention relates to a semiconductor laser device with an inner stripe structure that attains laser oscillation at an oscillation wavelength ranging from 660 nm to 890 nm.

2. Description of the Prior Art

In recent years, molecular beam epitaxy (MBE) and metal organic-chemical vapor deposition (MO-CVD) have been used as a crystal layer growth method for the production of semiconductor laser devices, especially GaAlAs semiconductor laser devices. According to these growth methods, a striped groove for the confinement of current therein that is formed on the substrate cannot be buried with a semiconductor material during a crystal growth process, but a growth layer with a uniform thickness is formed within the striped groove in accordance with the shape of the striped groove, and accordingly a built-in structure for confining current and carrier therein cannot be formed until a double-heterostructure in which an active layer is sandwiched between a pair of cladding layers has been disposed on the substrate. FIGS. 2(A) to 2(D) illustrate the above-mentioned method in which, as shown in FIG. 2(A), on an n-GaAs substrate 1, a double-heterostructure for sandwiching an n-active layer 3 between the n-cladding layer 2 and the p-cladding layer 4 is formed, and then an n-GaAs current blocking layer 5 having a conductive type different from that of the p-cladding layer 4 is formed on the p-cladding layer 4. Then, a striped groove is formed in the current blocking layer 5 by an etching technique, as shown in FIG. 2(B), in such a manner that the striped groove does not reach the p-$Al_{0.5}Ga_{0.5}As$ cladding layer 4. If the groove reached the p-cladding layer 4 so as to expose the p-cladding layer to the outside, the exposed surface of the p-cladding layer 4 is oxidized, which makes impossible the succeeding epitaxial crystal growth thereon. Then, the wafer with the above-mentioned striped groove is fed to the growth chamber of a MBE or MO-CVD apparatus. When the wafer is subjected to a molecular beam epitaxial treatment in the growth chamber, it is heated up to a temperature of 800° C. while being irradiated with As molecular beams. When the wafer undergoes a metal organic-chemical vapor deposition treatment, it is heated up to a temperature 800° C. while being irradiated with $AsH_3$ gas. By such a heating treatment, as shown in FIG. 2(C), the bottom portion of the striped groove of the current blocking layer 5 is etched so that the portion of the p-cladding layer 4 corresponding to the striped groove of the current blocking layer 5 is exposed to the outside. Then, as shown in FIG. 2(D), a p-$Al_{0.5}Ga_{0.5}As$ layer 6 and a p-GaAs cap layer 7 are successively grown on the wafer, resulting in a semiconductor laser device in which the n-GaAs current blocking layer 5 functions to confine current and light therein.

However, the above-mentioned production process has at least two difficult problems. Firstly, in the step shown in FIG. 2(B), it is very difficult to timely cut off the etching treatment with good reproducibility to thereby leave the portion with a thin thickness of the n-GaAs current blocking layer corresponding to the bottom portion of the striped groove. Secondly, in the step shown in FIG. 2(C), when the portion of the n-GaAs current blocking layer 5 corresponding to the bottom portion of the striped groove is subjected to a heat-etching treatment, it is very difficult to remove the said portion of the current blocking layer 5 with good reproducibility without thermally damaging the p-AlGaAs cladding layer 4.

SUMMARY OF THE INVENTION

The semiconductor laser device of this invention, which overcomes the above-discussed and numerous other disadvantages and deficiencies of the prior art, comprises a double-heterostructure that is composed of an active layer and a pair of cladding layers sandwiching said active layer therebetween, and a stripe structure that is disposed on said double-heterostructure, said stripe structure being composed of a current blocking layer with a conductive type different from that of the adjacent cladding layer, and said current blocking layer having a striped groove constituting a current path, wherein said cladding layer that contacts the current blocking layer is composed of an $In_{1-s}Ga_sP_{1-t}As_t$ crystal material (wherein $0.51 \leq s \leq 1$, $0 \leq t \leq 1$ and $s = 2.04t - 1.04$).

In a preferred embodiment, the current blocking layer is composed of a GaAs crystal material.

In a preferred embodiment, the active layer is composed of a GaAlAs crystal material or an $In_{1-y}Ga_yP_{1-z}As_z$ (wherein $0.51 \leq y \leq 1$, $0 \leq z \leq 1$ and $z = 2.04y - 1.04$).

Thus, the invention described herein makes possible the objectives of providing a semiconductor laser device in which a striped structure for confining current therein is disposed on a crystal material containing no components that are readily oxidized, and accordingly no complicated processes that are necessary to prevent the oxidation of the components are required, which allows the said laser device to attain stabilized laser oscillation.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1A:
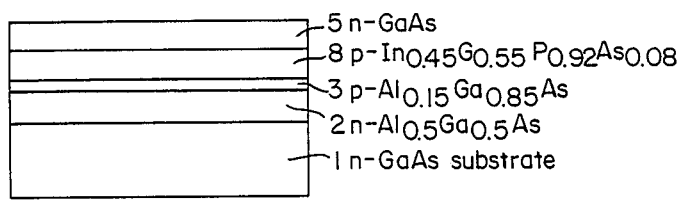
FIGS. 1A–1C are diagrams showing the production process of a semiconductor laser device of this invention.

FIG. 1 shows a semiconductor laser device of this invention, which is produced as follows:

As shown in FIG. 1(A), on an n-GaAs substrate 1, an n-$Al_{0.5}Ga_{0.5}As$ cladding layer 2 for confining light and carrier therein and a p-$Al_{0.15}Ga_{0.85}As$ active layer 3 for laser oscillating area are successively grown by MBE or MO-CVD. Then, on the wafer, a p-$In_{0.45}Ga_{0.55}P_{0.92}As_{0.08}$ cladding layer 8 that does not contain an Al component is grown, resulting in a double-heterostructure, followed by growing an n-GaAs current blocking layer 5 on the said p-cladding layer 8 by MBE or MO-CVD.

Figure 1B:
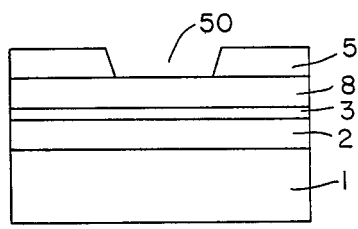

Then, as shown in FIG. 1(B), a striped groove 50 within which current is confined is formed in the current blocking layer 5 by an etching technique in such a manner that it reaches the p-cladding layer 8 and the portion of the p-cladding layer 8 corresponding to the bottom portion of the striped groove 50 is exposed to the outside. In this example, an etchant, which is a mixture in the proportion of 4 parts $H_2SO_4$, 2 parts $H_2O_2$ and 100 parts $H_2O$ at 10° C., is used. This etchant etches GaAs crystal materials, but it cannot etch $In_{0.45}Ga_{0.55}P_{0.92}As_{0.08}$ crystal materials, and accordingly by the use of this etchant, the above-mentioned striped groove can be formed in the n-GaAs current blocking layer 5 so as to reach the $p-In_{0.45}Ga_{0.55}P_{0.92}As_{0.08}$ cladding layer 8.

Figure 1C:
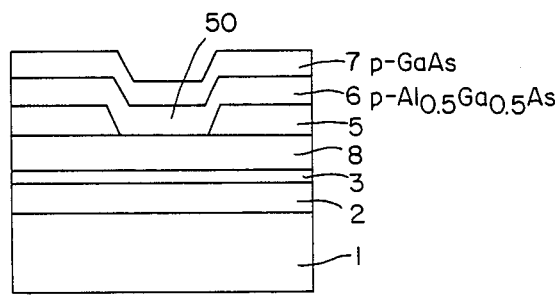
Figure 2A:
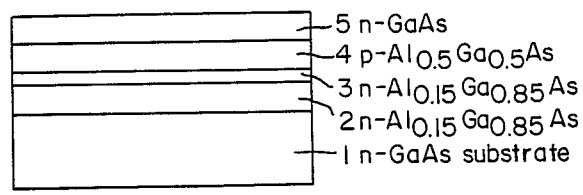
FIGS. 2A–2D are diagrams showing the production process of a conventional semiconductor laser device.
Figure 2B:
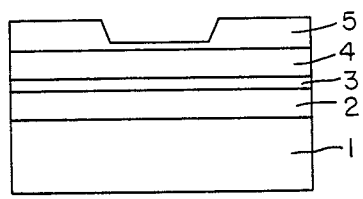
Figure 2C:
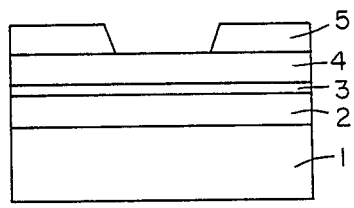
Figure 2D:
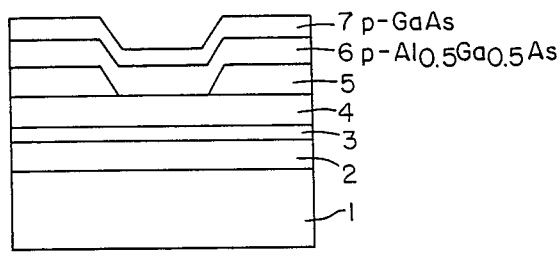

Then, as shown in FIG. 1(C), on the n-GaAs current blocking layer 5 including the striped groove 50, a p-$Al_{0.5}Ga_{0.5}As$ layer 6 and a p-GaAs cap layer 7 are successively grown. Since neither the side portions nor the bottom portion of the striped groove 50 contains an Al component such as AlGaAs crystal materials, there can be no Al oxidation, and therefore no troubles in succeeding crystal growth is encountered. Thus, a heat-etching treatment of the wafer in a growth chamber is not required.

By the above-mentioned way, a semiconductor laser device of this invention is obtainable, wherein a double-heterostructure, which is composed of a p-AlGaAs active layer 3 and an n-AlGaAs cladding layer 2 and a p-InGaPAs cladding layer 8 sandwiching the said active layer 3 therebetween, is disposed on an n-GaAs substrate 1. Moreover, a current-confining striped structure is disposed on the double-heterostructure. This laser device attains stabilized laser oscillation at an oscillation wavelength ranging from 660 nm to 890 nm. The p-InGaPAs cladding layer 8 that contacts the n-GaAs current blocking layer 5 must be composed of an $In_{1-s}Ga_sAs_{1-t}P_t$ crystal material wherein $0.51 \leq s \leq 1$, $0 \leq t \leq 1$, and $s = 2.04t - 1.04$, so that the lattice match between the GaAs crystal material and the GaAlAs crystal material can be attained. Even though the p-InGaPAs cladding layer 8 was exposed to air, it is not readily oxidized. Moreover, the p-InGaPAs cladding layer 8 functions to confine carrier and light (of the p-AlGaAs active layer 3) therein in the same manner as the p-AlGaAs cladding layer 4 shown in FIG. 2.

This invention is not limited to the structure of the above-mentioned laser device, but it is applicable to a structure in which carrier barrier layers or optical guiding layers are disposed between the active layer 3 and the cladding layer 2 and between the active layer 3 and the cladding layer 8, respectively. This invention is also applicable to a semiconductor laser device with an active layer 3 of $In_{1-y}Ga_yP_{1-z}As_z$ (wherein $0.51 \leq y \leq 1$, $0 \leq z \leq 1$ and $z = 2.04y - 1.04$) instead of GaAlAs.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a double-heterostructure that is composed of an active layer and a pair of cladding layers comprising first and second cladding layers, sandwiching said active layer therebetween, and a stripe structure that is disposed on said second cladding layer, said stripe structure being composed of a current blocking layer with a conductive type different from that of said second cladding layer, and said current blocking layer having a striped groove constituting a current path, the improvement comprising said second cladding layer that contains no components that are readily oxidized and that is composed of an $In_{1-s}Ga_sP_{1-t}As_t$ crystal material (wherein $0.51 \leq s \leq 1$, $0 \leq t \leq 1$ and $s = 2.04t - 1.04$).

2. A semiconductor laser device according to claim 1, wherein said current blocking layer is composed of a GaAs crystal material.

3. A semiconductor laser device according to claim 1, wherein said active layer is composed of a GaAlAs crystal material.

4. A semiconductor laser device according to claim 1, wherein said active layer is composed of an $In_{1-y}Ga_yP_{1-z}As_z$ (wherein $0.51 \leq y \leq 1$, $0 \leq z \leq 1$ and $z = 2.04y - 1.04$) crystal material.

* * * * *